(12) United States Patent
Bhushan et al.

(10) Patent No.: US 11,829,852 B1
(45) Date of Patent: Nov. 28, 2023

(54) SYSTEM, METHOD, AND COMPUTER PROGRAM PRODUCT FOR PREDICTING PIN PLACEMENT IN AN ELECTRONIC DESIGN

(71) Applicant: Cadence Design Systems, Inc., San Jose, CA (US)

(72) Inventors: Sai Bhushan, Greater Noida (IN); Chirag Ahuja, North Melbourne (AU)

(73) Assignee: Cadence Design Systems, Inc., San Jose, CA (US)

(*) Notice: Subject to any disclaimer, the term of this patent is extended or adjusted under 35 U.S.C. 154(b) by 759 days.

(21) Appl. No.: 17/007,023

(22) Filed: Aug. 31, 2020

(51) Int. Cl.
*G06N 20/00* (2019.01)
*H01L 23/00* (2006.01)
*G06F 30/33* (2020.01)
*G06F 18/214* (2023.01)

(52) U.S. Cl.
CPC .......... *G06N 20/00* (2019.01); *G06F 18/214* (2023.01); *G06F 30/33* (2020.01); *H01L 24/42* (2013.01); *H01L 2924/14* (2013.01)

(58) Field of Classification Search
CPC ....... G06N 20/00; G06F 30/33; G06F 18/214; H01L 24/42; H01L 2924/14
See application file for complete search history.

(56) References Cited

U.S. PATENT DOCUMENTS

| | | | | |
|---|---|---|---|---|
| 11,481,238 B2* | 10/2022 | Gandhi | ................... | G06F 9/453 |
| 11,620,548 B1* | 4/2023 | Bhushan | ............... | G06N 20/00 |
| | | | | 706/12 |
| 2012/0198408 A1* | 8/2012 | Chopra | ............... | G06F 30/3323 |
| | | | | 716/127 |

\* cited by examiner

*Primary Examiner* — David E Choi
(74) *Attorney, Agent, or Firm* — Mark Whittenberger, Esq.; Holland & Knight LLP

(57) ABSTRACT

The present disclosure relates to a computer-implemented method for automatically determining pin placement associated with an electronic design. Embodiments may include receiving, using at least one processor, at least one layout associated with the electronic design and separating the at least one layout into one or more grids. Embodiments may also include extracting one or more connectivity features from the one or more grids, wherein the one or more connectivity features include instance-pin and pin information. Embodiments may also include training a machine learning model, based upon, at least in part, the one or more connectivity features and receiving the machine learning model and a test layout at a predictor engine. Embodiments may further include providing a user with a pin placement recommendation based upon, at least in part, the machine learning model and the test layout.

20 Claims, 7 Drawing Sheets

300

Top-down

Bottom-up

■ Fixed Pins
☐ Flexible Pins

300

■ Fixed Pins
□ Flexible Pins

SYSTEM, METHOD, AND COMPUTER PROGRAM PRODUCT FOR PREDICTING PIN PLACEMENT IN AN ELECTRONIC DESIGN

GOVERNMENT RIGHTS

This invention was made with Government support under Agreement No. HR0011-18-3-0010, awarded by DARPA. The Government has certain rights in the invention.

FIELD OF THE INVENTION

The present disclosure relates to electronic circuit design, and more specifically, to predicting pin placement associated with electronic designs.

DISCUSSION OF THE RELATED ART

In existing electronic design approaches, most designers either manually create pin placements for their designs based on their past knowledge or by using a pin-optimizer tool that may attempt to optimize wire-length. However, this often leads to unnecessary congestion. Any congestion-aware pin placement is good only if a detailed router follows the guidance of a global router, which at times is not true.

SUMMARY

In one or more embodiments of the present disclosure, a computer-implemented method for automatically determining pin placement associated with an electronic design is provided. The method may include receiving, using at least one processor, at least one layout associated with the electronic design and separating the at least one layout into one or more grids. The method may also include extracting one or more connectivity features from the one or more grids, wherein the one or more connectivity features include instance-pin and pin information. The method may also include training a machine learning model, based upon, at least in part, the one or more connectivity features and receiving the machine learning model and a test layout at a predictor engine. The method may further include providing a user with a pin placement recommendation based upon, at least in part, the machine learning model and the test layout.

One or more of the following features may be included. In some embodiments, separating the at least one layout into one or more grids includes splitting at least one edge of a boundary into a plurality of segments. In some embodiments, a pin location may be specified by an edge number. In some embodiments, an instance-pin location may be specified by a grid number. The method may include determining a number of instance-pins per grid. Training the machine learning model may include training on one or more fully routed electronic design layouts. The method may include providing the machine learning model to a pin optimizer in order to predict an initial solution set.

In yet another embodiment of the present disclosure a non-transitory computer readable medium having stored thereon instructions that when executed by a processor result in one or more operations is included. Operations may include receiving, using at least one processor, at least one layout associated with the electronic design and separating the at least one layout into one or more grids. Operations may also include extracting one or more connectivity features from the one or more grids, wherein the one or more connectivity features include instance-pin and pin information. Operations may also include training a machine learning model, based upon, at least in part, the one or more connectivity features and receiving the machine learning model and a test layout at a predictor engine. Operations may further include providing a user with a pin placement recommendation based upon, at least in part, the machine learning model and the test layout.

One or more of the following features may be included. In some embodiments, separating the at least one layout into one or more grids includes splitting at least one edge of a boundary into a plurality of segments. In some embodiments, a pin location may be specified by an edge number. In some embodiments, an instance-pin location may be specified by a grid number. Operations may include determining a number of instance-pins per grid. Training the machine learning model may include training on one or more fully routed electronic design layouts. Operations may include providing the machine learning model to a pin optimizer in order to predict an initial solution set.

In one or more embodiments of the present disclosure, a system for automatically determining pin placement associated with an electronic design is provided. The system may include a memory and a computing device having at least one processor. The at least one processor configured to receive at least one layout associated with the electronic design and to separate the at least one layout into one or more grids. The at least one processor may be further configured to extract one or more connectivity features from the one or more grids, wherein the one or more connectivity features include instance-pins and pin information. The at least one processor may be further configured to train a machine learning model, based upon, at least in part, the one or more connectivity features. The at least one processor may be further configured to receive the machine learning model and a test layout at a predictor engine. The at least one processor may be further configured to provide a user with a pin placement recommendation based upon, at least in part, the machine learning model and the test layout.

One or more of the following features may be included. In some embodiments, separating the at least one layout into one or more grids may include splitting at least one edge of a boundary into a plurality of segments. A pin location may be specified by an edge number and an instance-pin location may be specified by a grid number. The at least one processor may be further configured to determine a number of instance-pins per grid. Training the machine learning model may include training on one or more fully routed electronic design layouts.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
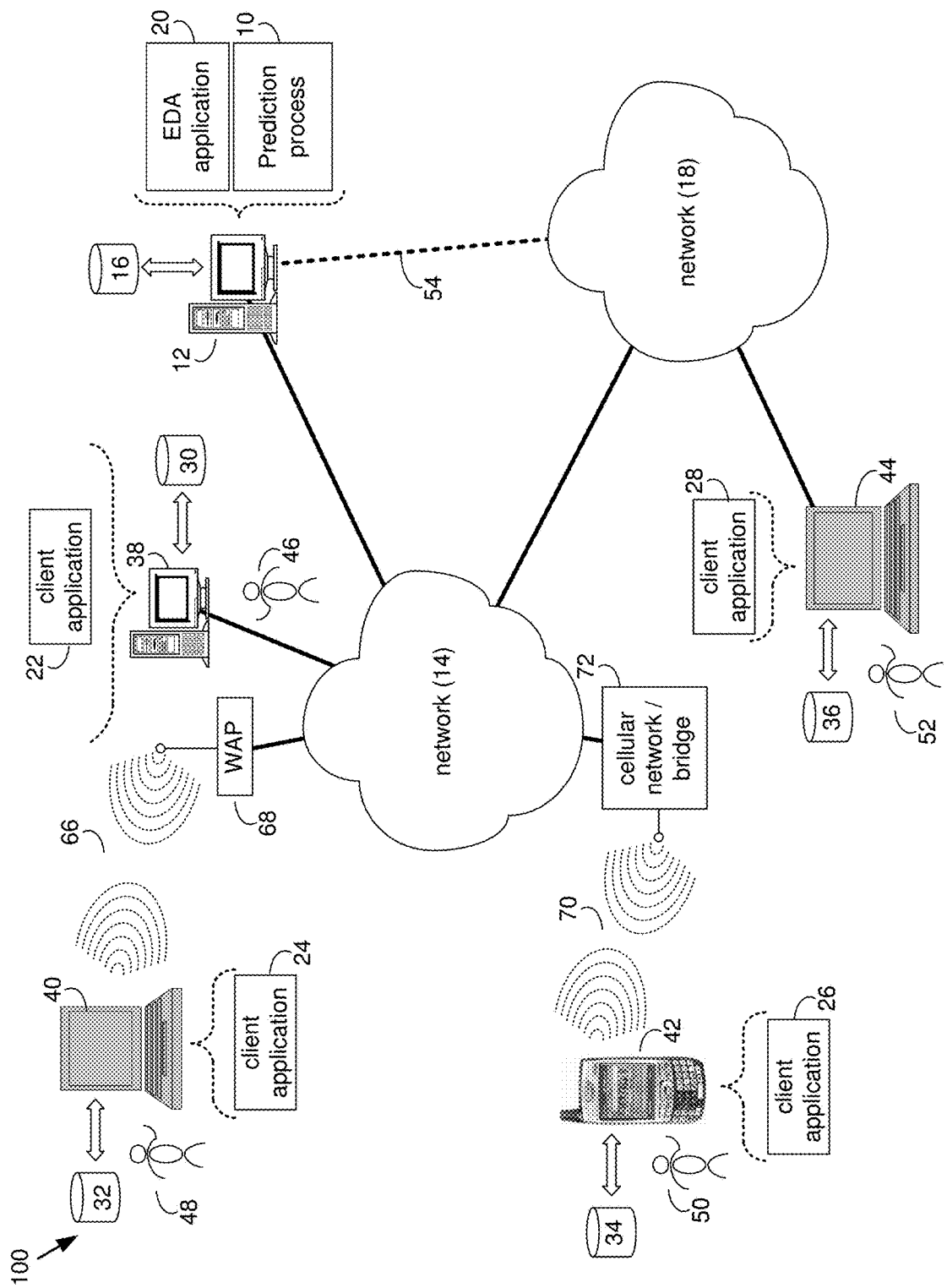
FIG. 1 is a diagram depicting an embodiment of a system in accordance with the present disclosure.

Embodiments of the present disclosure are directed towards a methodology that automatically determines the appropriate pin placement associated with an electronic design. One or more electronic design layouts may be received and the process may separate each layout into one or more grids. Embodiments may also include extracting connectivity features (e.g., instance-pin and pin information) from the grids. Embodiments may also include training a machine learning model, based upon the connectivity features and receiving the machine learning model and a test layout at a predictor engine. Embodiments may further include providing a user with a pin placement recommendation based upon a recommendation from the predictor engine.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosures. Some hardware description languages may include, but are not limited to, Verilog, VHDL, and Verilog-AMS. Various other hardware description languages may also be used as well.

Referring to FIG. 1, there is shown prediction process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, process 10 may reside on and be executed, in whole or in part, by a client electronic device, such as a personal computer, notebook computer, personal digital assistant, or the like.

The instruction sets and subroutines of prediction process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Prediction process 10 may be a stand alone application, or may be an applet/application/script that may interact with and/or be executed within EDA application 20. In addition/as an alternative to being a server-side process, the prediction process may be a client-side process (not shown) that may reside on a client electronic device (described below) and may interact with an EDA client application (e.g., one or more of EDA client applications 22, 24, 26, 28). Further, the prediction process may be a hybrid server-side/client-side process that may interact with EDA application 20 and an EDA client application (e.g., one or more of client applications 22, 24, 26, 28). As such, the processes may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize prediction process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54. Some or all of the operations discussed herein with regard to prediction process 10 may be performed, in whole or in part, in the cloud as a cloud-based process including, for example, networks 14, 18 and any others.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Figure 2:
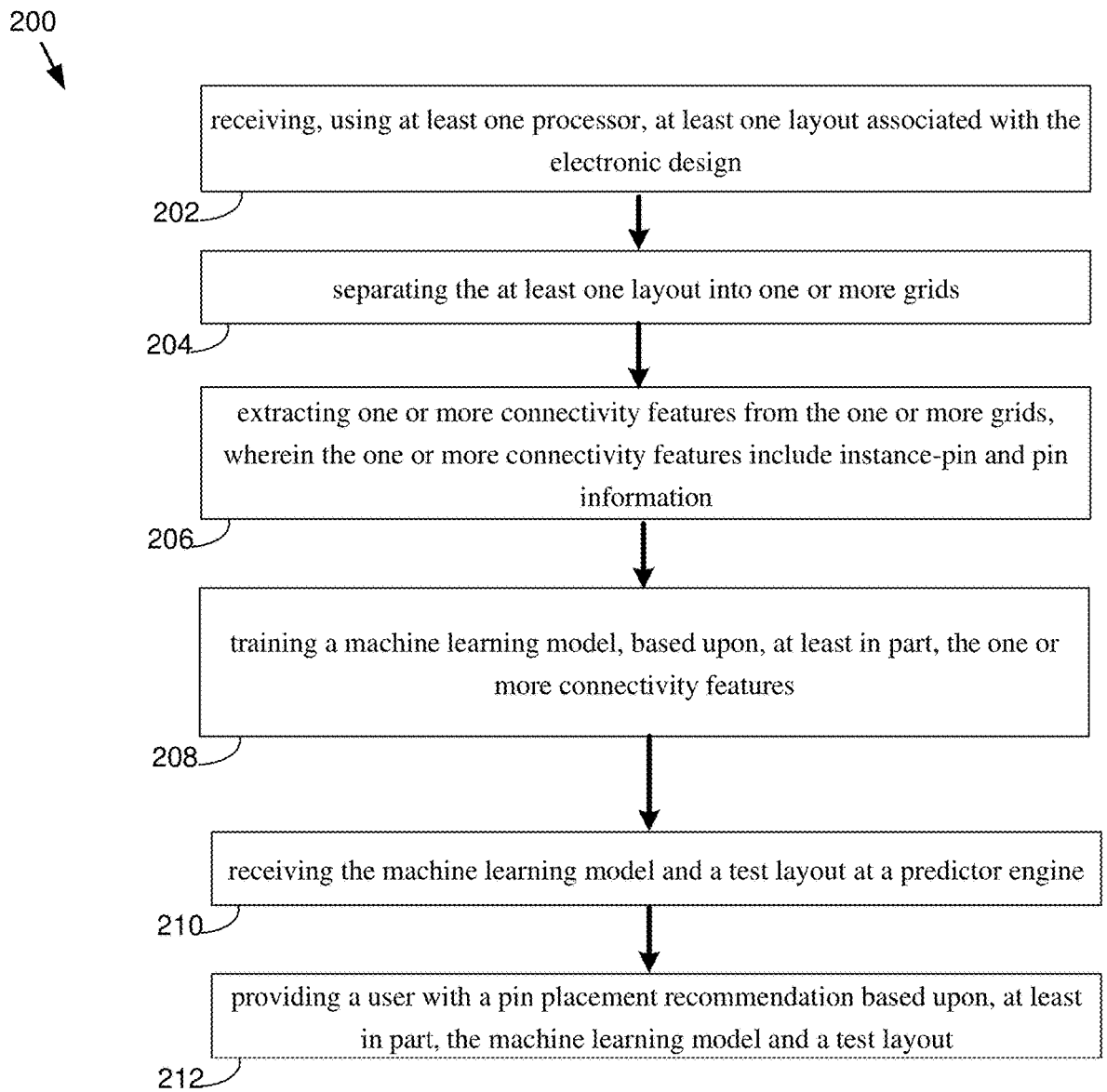
FIG. 2 is a flowchart depicting operations consistent with the prediction process in accordance with an embodiment of the present disclosure.

Referring now to FIGS. 2-7, numerous flowcharts and diagrams consistent with embodiments of prediction process 10 are provided. FIG. 2 shows an example flowchart depicting operations for automatically determining a pin placement associated with an electronic design. Prediction process 10 may include receiving (202), using at least one processor, at least one layout associated with the electronic design and separating (204) the at least one layout into one or more grids. The method may also include extracting (206) one or more connectivity features from the one or more grids, wherein the one or more connectivity features include instance-pin and pin information. The method may also include training (208) a machine learning model, based upon, at least in part, the one or more connectivity features and receiving (210) the machine learning model and a test layout at a predictor engine. The method may further include providing (212) a user with a pin placement recommendation based upon, at least in part, the machine learning model and the test layout. Numerous other operations are also within the scope of the present disclosure.

Existing tools may provide decent results for two pin nets. However, for multi-pin nets, these tools may provide results that require further manual fine-tuning. Pin-optimizer tools may attempt to optimize on wire-length but that could result in congestion. The congestion-aware pin placement is good only if the detailed-router follows the guidance of global router (which at times is not true). Accordingly, embodiments of the present disclosure may allow for the automatic determination of pin placements for multi-pin nets using the knowledge extracted from previously routed designs.

Referring now to FIGS. 3-7, embodiments of prediction process 10 may be configured to receive one or more placed layouts as an input. The layout may be broken down into one or more grids. Connectivity features may be extracted for each grid and the schematic information for the instance-pins and pins may be taken into account. The schematic for a design may capture the connectivity of the instances with respect to the pins. Each pin may be connected to a net, which in turn connects to multiple instances through the instance-pins (also referred as inst-terms). An instance may have one or more instance-pins and these instance-pins may be connected to the same or different nets. When a layout is generated from a given schematic, then the connectivity of the pins and instances is kept intact, e.g., the connections of the pins to their respective instance-pins may be maintained in sync with the schematic. There are other useful properties in the schematic that are of relevance for deciding the pin-placement, e.g., position of pin in the schematic, type of net (e.g., power, ground, clock, etc.) to which the pin is connected to, the type of pin (e.g., input, output, bi-directional, etc.). These features may then be sent to a machine learning model and trained across several designs to achieve reasonable accuracy. Embodiments of prediction process 10 may transform the problem into a machine learning problem independent of the size of layout. In this way, prediction process 10 may provide a pin placement solution that provides routable solutions since its trained on fully routed layouts. The results of this machine learning model could also serve as initial solution set for a pin optimization tool (e.g., Virtuoso Pin Optimizer available from the Assignee of the present disclosure) so that it may begin with a good initial solution and optimize further on it.

Figure 3:
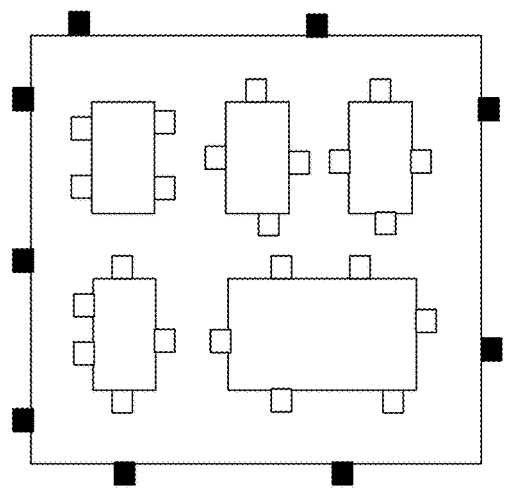
FIG. 3 is a graphical user interface depicting top-down and a bottom-up modes in accordance with an embodiment of the present disclosure.
Figure 3:
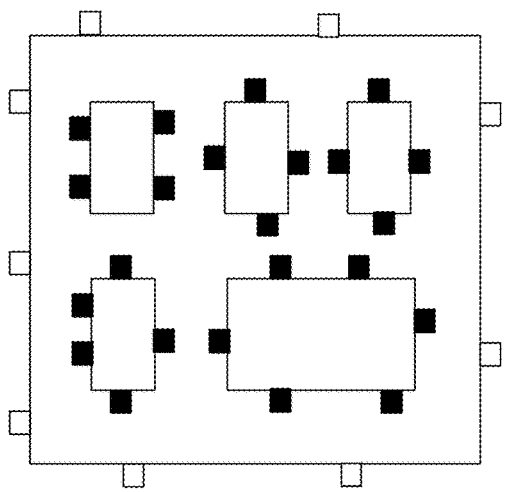

As used herein, the phrase "pin placement" may refer to locating the best position/placement of pins for the chip/block or for the contained soft-blocks in order to provide optimum routing in an electronic design. As shown in FIG. 3, there may be two methodologies used for pin-placement, one is a top-down approach and the other is a bottom-up approach. In the top-down methodology, the location of pins for the design/block may be fixed and locked, the location of instances/sub-blocks may be fixed, but the location of pins for the instance/sub-blocks may be flexible. The requirement is to find the best possible location for instance-pins in order to get the most optimal routing results. In the bottom-up methodology, the location of instances/sub-blocks may be fixed, the location of their instance-pins may be fixed but the location of top-level block/design pins may be flexible. The requirement is to find the location of the pins for the block/design that would give the most optimum routing results. This work primarily focuses on predicting pin-placement for bottom-up design methodology.

Accordingly, prediction process 10 may assist the user to place their pins properly using system-generated recommendations from the machine learning system. Embodiments included herein may be more suited for a bottom-up design methodology as is discussed in further detail hereinbelow. Accordingly, in some embodiments, the machine learning system expects to have layouts with placed instances/blocks. The prediction may be performed only for the pins on the boundary.

In some embodiments, prediction process 10 may predict the placement of top-level pins of a block, based on the placement of instances and devices within the block. Accordingly, prediction process 10 may build a machine learning model that shows reasonable accuracy for a given design methodology and technology. This approach attempts to infer user-intent automatically instead of having the user add any constraints or pin-guides. Prediction process 10 may be integrated with an EDA application 20, which may include a pin optimization engine to provide initial suggestions/hints based on the machine learning model.

Figure 4:
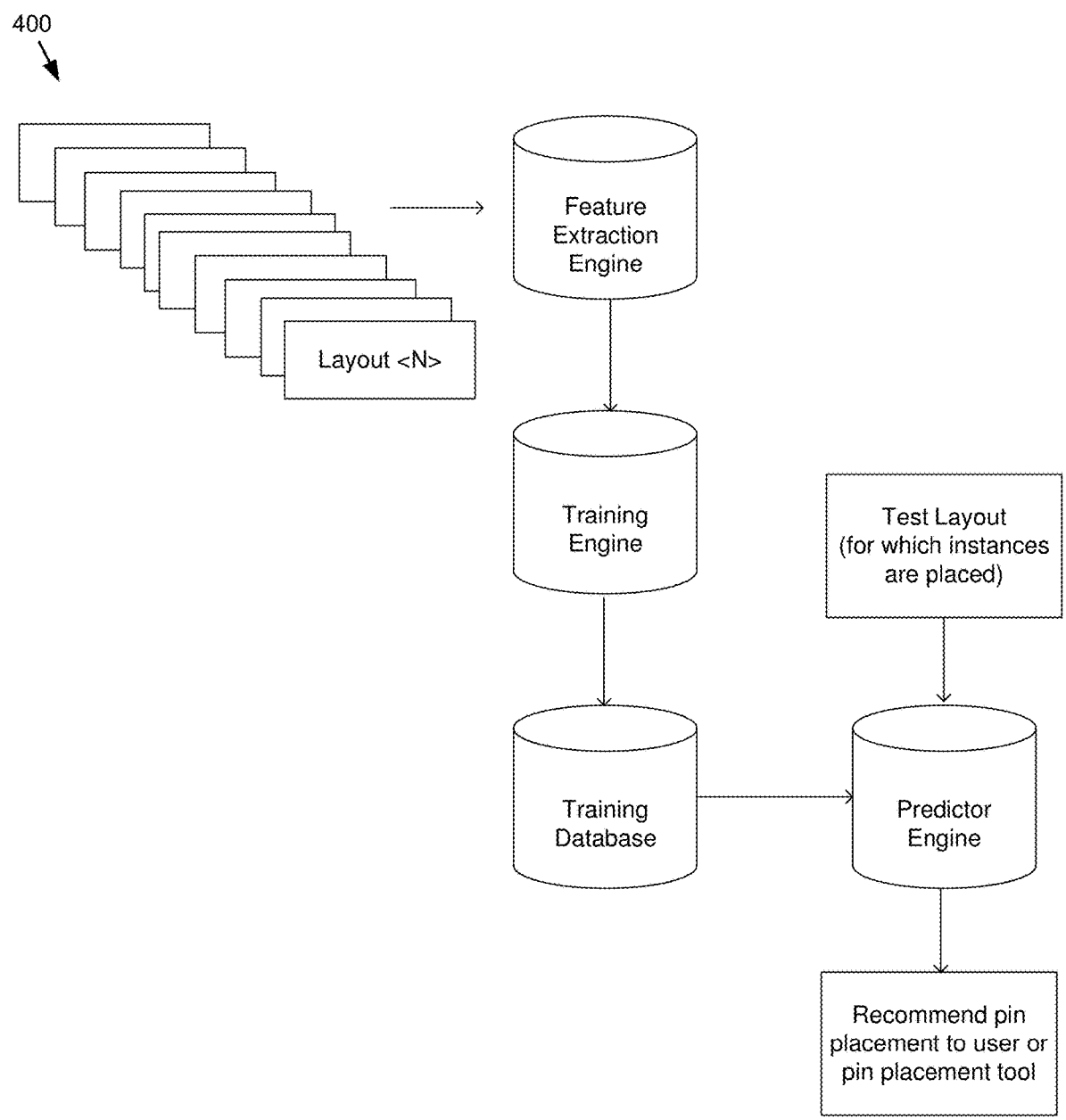
FIG. 4 is a diagram in accordance with an embodiment of the present disclosure.

Referring now to FIG. 4, a flowchart depicting an embodiment consistent with prediction process 10 is provided. The system may be configured to receive a one or more layouts at a feature extraction engine and a training engine. The training engine may provide results to a training database. A predictor engine may receive data from the training database and one or more test layouts for which instances may be placed. The predictor engine may then provide the user with an option to accept or decline a potential pin placement recommendation at a graphical user interface. The fully routed layouts, along with their schematics, are passed to the Feature Extraction Engine to extract connectivity features and schematic information relevant for pin-placement prediction. There is a set of connectivity features for each pin and that may be used as feature/input data for the machine-learning model. The location of pins in these routed layouts are used as golden/label data for the machine-learning model. The training engine may perform the processing of input/feature data and label/golden data to tune the parameters of the machine-learning model through an optimization process. The output of the training engine is a trained machine-learning that is stored as training database, which may later be used for predicting pin-placements for a new set of test-layouts. It should be noted that the test-layouts may have already gone through the placement step, which means that the instances/sub-blocks are already placed. The predictor engine may use the connectivity features of the test-layout and the passes it as input to the machine learning model to predict the pin-placement.

Figure 5:
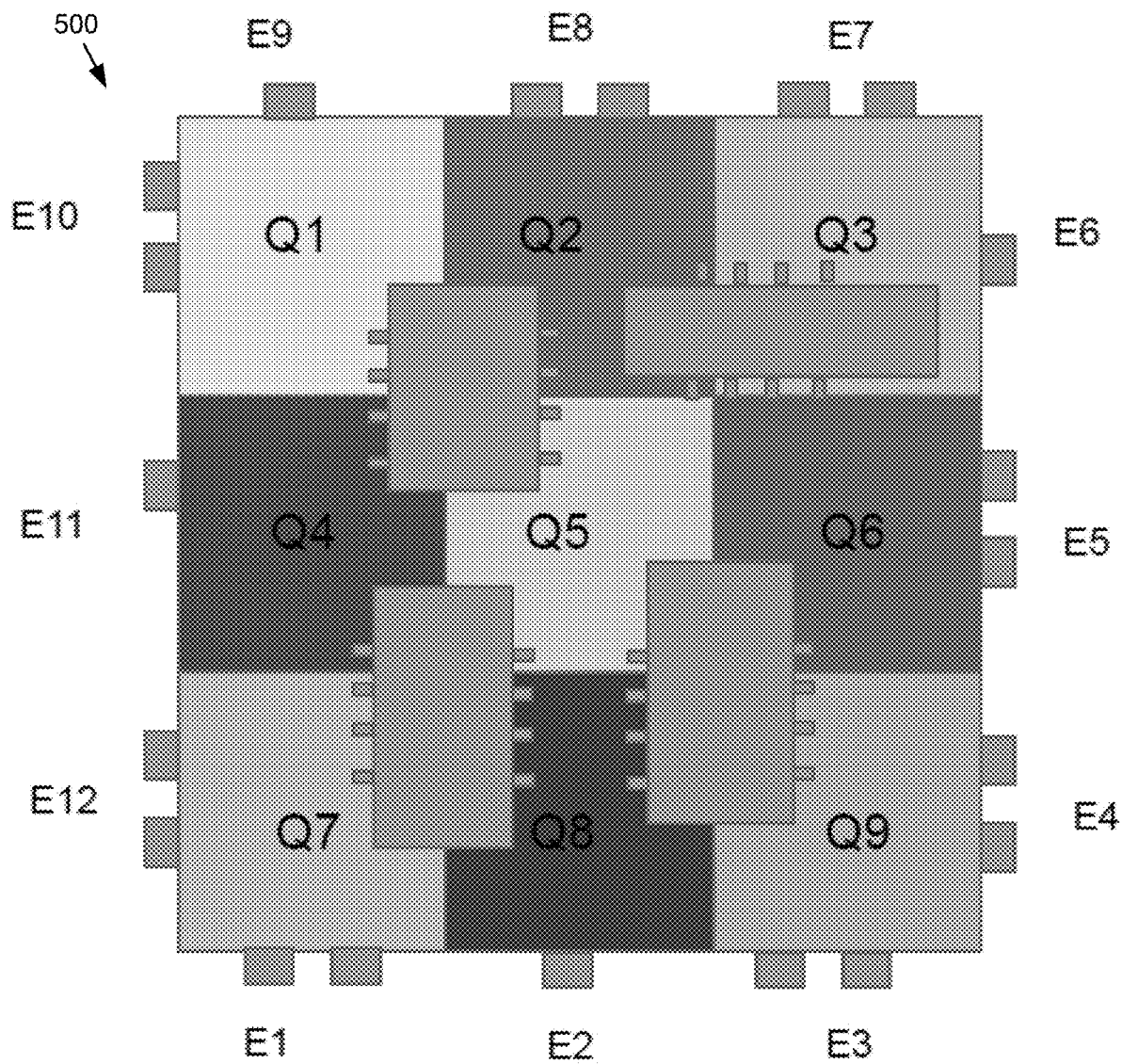
FIG. 5 is a graphical user interface depicting a layout, split into multiple grids, in accordance with an embodiment of the present disclosure.

Referring now to FIG. 5, an example layout showing an implementation of prediction process 10 is provided. In operation, the process may begin by breaking an example layout 400 into a grid. For an, N×N grid, there may be $N^2$ quadrants and 4N edges. In some embodiments, the grid-resolution may be customizable. For a 3×3 grid, for example, there are 9 quadrants and 12 edges. Each row in the feature-data for the machine learning model may represent information for a net in the cellview. Each row in the label-data for the machine learning model contains 4N (4×3=12) entries. In operation, prediction process 10 may determine that the entry is a 1 if the pin is on/near the edge number, otherwise, it is a 0. Each row in the training data contains $2N^2$ (2×3²=18) entries, for example, with two entries for each grid/quadrant. These entries may include the number of instance-pins in that quadrant connecting to the same net and the number of instance-pins in that quadrant connecting to other nets.

For example, layout 400 depicts a 3×3 grid that is broken into 9 distinct quadrants (e.g., Q1-Q9) and 12 distinct edges (e.g., E1-E12). Prediction process 10 may then split the edges of a boundary into multiple segments. In some embodiments, the location of a pin may be specified by an edge number and the location of one or more instance-pins may be specified by a grid-number. FIG. 5 depicts four distinct instances located within the grid along with their instance-pins represented with small gray boxes around each of the instance-boundaries. The exact location of the instance-pin may not be used for the training purpose, instead the relative grid location of the instance-pin is used as input feature for the training model. For example, the top-left instance has 2 instance-pins in each of the Q1, Q2, Q4 and Q5 quadrants. Prediction process 10 may be configured to capture the number of instance-pins per grid.

In some embodiments, prediction process 10 may utilize supervised learning techniques, which may operate upon both training data and testing data. The input to the machine learning model may be referred to as the Feature(s) and the predicted output of machine-learning may be compared against a golden data (which is referred to as Label). The training data may include, but is not limited to, a location of instance-pins for an inspected net [Feature], a location of instance-pins for other (non-inspected) nets [Feature], and a location of Pin (in terms of edges) [Label]. The training of the machine learning model essentially aims at tuning the parameters of the model to reduce the error between the predicted output and golden/actual output. The features and labels may be extracted from the given routed layouts by the Feature Extraction Engine (as depicted in FIG. 4). The same set of features may also be extracted for the test-data and passed to the machine-learning model to predict the output. The input may correspond to the location of instance-pins of inspected net and other nets (in terms of quadrants) of a test-layout (for which the placement is complete) and the output may correspond to the location of pin associated with the inspected net (in terms of edges).

Figure 6:
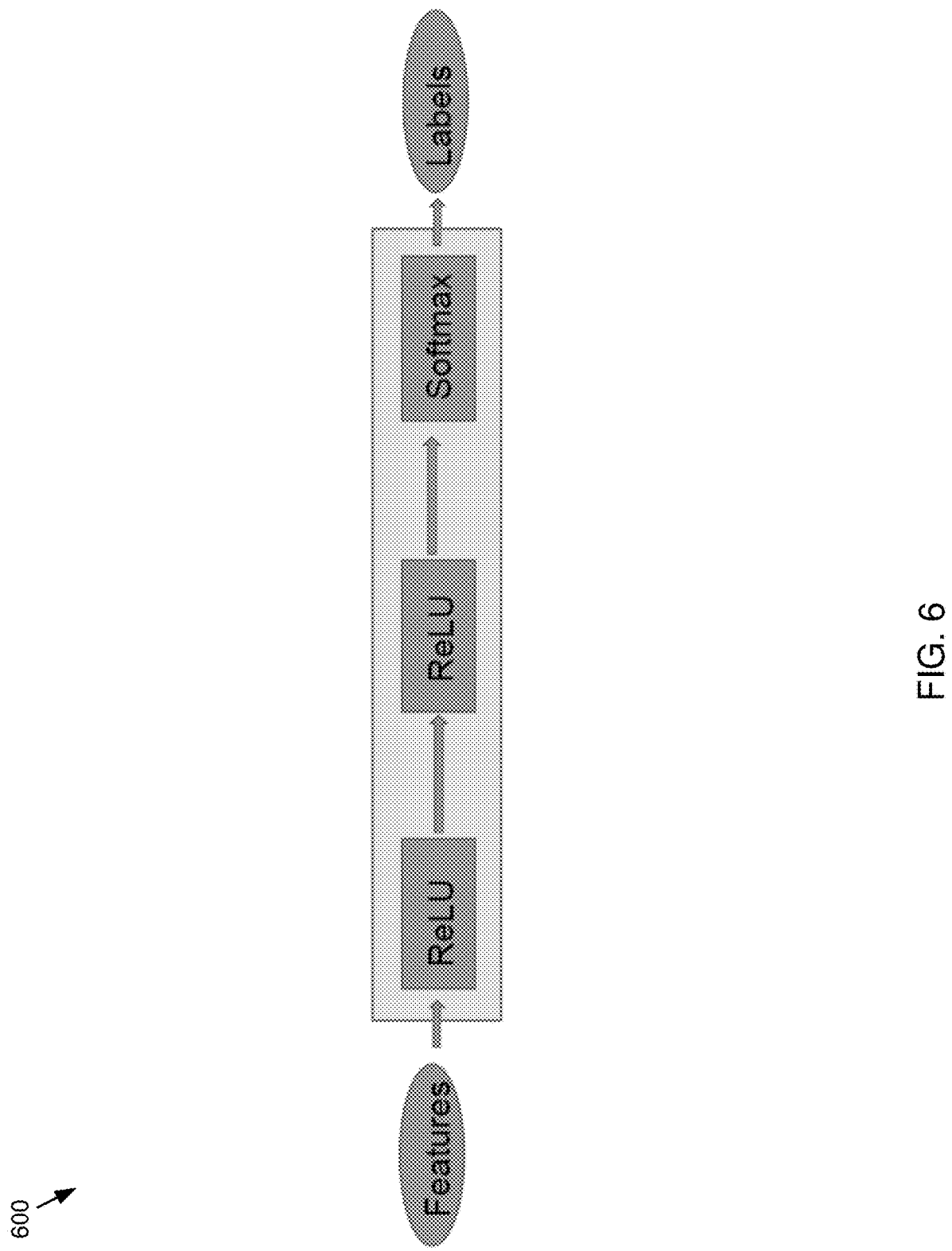
FIG. 6 is a flowchart depicting an example of a machine learning model in accordance with an embodiment of the present disclosure.

Referring now to FIG. 6, an embodiment showing a flowchart 500 of a deep learning model associated with prediction process 10 is provided. In some embodiments, deep learning classification methods may be employed in accordance with the teachings of the present disclosure. In the case of deep learning, the machine learning model may be any suitable model such as a Sequential Model from Keras (a deep-learning framework). This particular model may include multiple layers (e.g., −2 layers for "ReLU" (Rectified Linear Unit) and last layer is "Softmax". The ReLU and Softmax are activation functions used in the layers of a deep-learning neural network model. ReLU provides linear activation, whereas Softmax provides non-linear activation. These functions are available in $3^{rd}$ party libraries provided by various machine-learning frameworks (e.g., Keras) and are provided merely by way of example. The tuning of a deep-learning model is essentially the process of adjusting the parameters/weights for these linear and non-linear activation functions using an optimizer (e.g. "rmsprop"). The optimizer aims at reducing the error margin between predicted and actual output. Various classification methods may also be employed. Some of these may include, but are not limited to, Random Forest Classifier, KNeighborsClassifier, etc.

Figure 7:
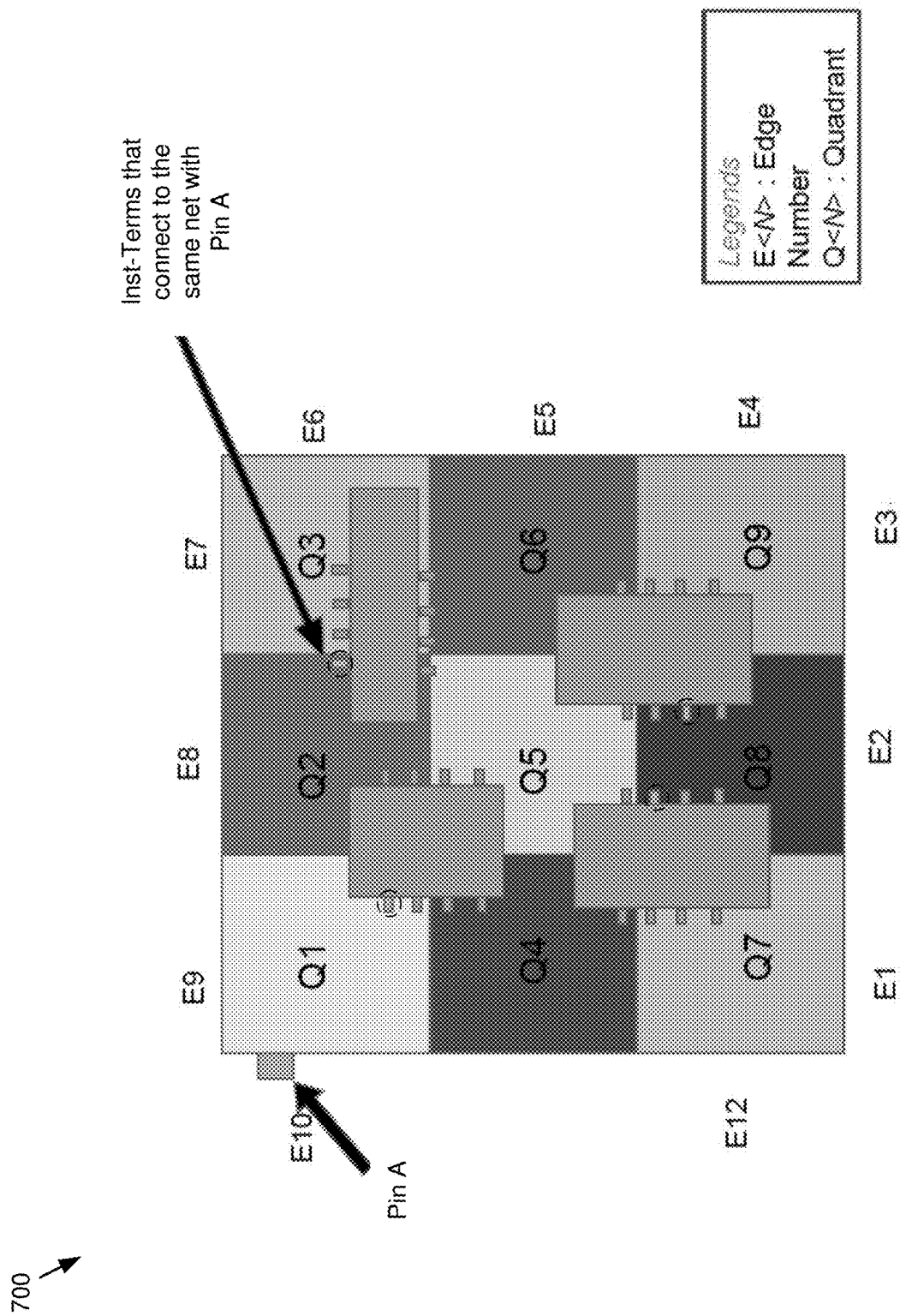
FIG. 7 is a graphical user interface depicting a layout, split into multiple grids, in accordance with an embodiment of the present disclosure.

Referring now to FIG. 7, an embodiment showing an example layout showing an implementation of prediction process 10 is provided. In this example, the pin being inspected is "Pin A" on Edge 10. The instance-pins (labeled as inst-terms in the figure) that connect to the same net associated with the pin are circled. The row of label data for the pin (e.g., 3×4=12 entries) corresponds to [0, 0, 0, 0, 0, 0, 0, 0, 0, 1, 0, 0]. The pin was on edge 10 (E10), so in this particular example only the 10th entry is 1, the rest all are 0. The row of feature data (2×32=18 entries) corresponds to [(1, 1), (1, 3), (0, 6), (0, 3), (0, 4), (0, 1), (0, 3), (2, 4), (0, 3)]. Here, each tuple refers to an entry for a quadrant. The first value of the tuple refers to the number of instance-pins connected to the same (or inspected) net associated with the pin. The second value of the tuple refers to the number of instance-pins connected to the other nets.

In some embodiments, the normalization of training data improves accuracy. Extra features may be employed to increase the training accuracy, some of which may include, but are not limited to, schematic pin position, signal type (power, ground, clock etc.), pin type (e.g., input, output, bi-directional etc.).

Embodiments included herein may analyze an existing placement (e.g., schematic, layouts, .txt files, etc.) as a reference placement and optimize both instances and pins placement together during some embodiments. Moreover, some embodiments may optimize the aspect ratio of a group. Each of these concepts as well as additional genetic placement techniques are discussed in further detail in U.S. patent application Ser. No. 16/527,412, which is incorporated by reference herein in its entirety. A genetic algorithm ("GA") generally refers to a bio-inspired or evolutionary algorithm that may be used for optimization and search problems. A GA may simulate the process of natural selection and evolution. The goal is to find the best "fit" individuals or those with the best genes. It should be noted that although certain embodiments included herein may reference genetic algorithms, any analysis process may be used in accordance with the teachings of the present disclosure.

Embodiments of the present disclosure provide numerous advantages over existing approaches. Prediction process 10 may be configured to reduce human effort in capturing intent as constraints/guides and may provide a good initial solution for a pin optimization algorithm. Moreover, prediction process 10 may be used to automatically generate pin-guides and pin-alignment constraints.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for automatically determining pin placement associated with an electronic design comprising:
   receiving, using at least one processor, at least one layout associated with the electronic design;
   separating the at least one layout into one or more grids;
   extracting one or more connectivity features from the one or more grids, wherein the one or more connectivity features include instance-pin and pin information;
   training a machine learning model, based upon, at least in part, the one or more connectivity features;
   receiving the machine learning model and a test layout at a predictor engine; and
   providing a user with a pin placement recommendation based upon, at least in part, the machine learning model and the test layout.

2. The computer-implemented method for electronic design of claim 1, wherein separating the at least one layout into one or more grids includes splitting at least one edge of a boundary into a plurality of segments.

3. The computer-implemented method for electronic design of claim 2, wherein a pin location is specified by an edge number.

4. The computer-implemented method for electronic design of claim 3, wherein an instance-pin location is specified by a grid number.

5. The computer-implemented method for electronic design of claim 4, further comprising:
   determining a number of instance-pins per grid.

6. The computer-implemented method for electronic design of claim 2, wherein training the machine learning model includes training on one or more fully routed electronic design layouts.

7. The computer-implemented method for electronic design of claim 3, further comprising:
   providing the machine learning model to a pin optimizer to predict an initial solution set.

8. A non-transitory computer-readable storage medium having stored thereon instructions, which when executed by a processor result in one of more operations for automatically determining pin placement associated with an electronic design, the operations comprising:
   receiving, using at least one processor, at least one layout associated with the electronic design;
   separating the at least one layout into one or more grids;
   extracting one or more connectivity features from the one or more grids, wherein the one or more connectivity features include instance-pin and pin information;
   training a machine learning model, based upon, at least in part, the one or more connectivity features;
   receiving the machine learning model and a test layout at a predictor engine; and
   providing a user with a pin placement recommendation based upon, at least in part, the machine learning model and the test layout.

9. The non-transitory computer-readable storage medium of claim 8, wherein separating the at least one layout into one or more grids includes splitting at least one edge of a boundary into a plurality of segments.

10. The non-transitory computer-readable storage medium of claim 9, wherein a pin location is specified by an edge number.

11. The non-transitory computer-readable storage medium of claim 10, wherein an instance-pin location is specified by a grid number.

12. The non-transitory computer-readable storage medium of claim 11, further comprising:
    determining a number of instance-pins per grid.

13. The non-transitory computer-readable storage medium of claim 9, wherein training the machine learning model includes training on one or more fully routed electronic design layouts.

14. The non-transitory computer-readable storage medium of claim 10, further comprising:
    providing the machine learning model to a pin optimizer to predict an initial solution set.

15. A system for automatically determining pin placement associated with an electronic design comprising:
    a memory; and
    at least one processor configured to receive at least one layout associated with the electronic design and to separate the at least one layout into one or more grids, the at least one processor further configured to extract one or more connectivity features from the one or more grids, wherein the one or more connectivity features include instance-pin and pin information, the at least one processor further configured to train a machine learning model, based upon, at least in part, the one or more connectivity features, the at least one processor further configured to receive the machine learning model and a test layout at a predictor engine, the at least one processor further configured to provide a user with a pin placement recommendation based upon, at least in part, the machine learning model and the test layout.

16. The system of claim 15, wherein separating the at least one layout into one or more grids includes splitting at least one edge of a boundary into a plurality of segments.

17. The system of claim 16, wherein a pin location is specified by an edge number.

18. The system of claim 17, wherein an instance-pin location is specified by a grid number.

19. The system of claim 18, wherein the at least one processor is further configured to extract the number of instance-pins per grid.

20. The system of claim 15, wherein training the machine learning model includes training on one or more fully routed electronic design layouts.

* * * * *